United States Patent [19]
Willming

[11] Patent Number: 5,787,129
[45] Date of Patent: Jul. 28, 1998

[54] DECODER FOR A TRELLIS ENCODED SIGNAL CORRUPTED BY NTSC CO-CHANNEL INTERFERENCE AND WHITE NOISE

[75] Inventor: David A. Willming, Palatine, Ill.

[73] Assignee: Zenith Electronics Corporation, Glenview, Ill.

[21] Appl. No.: 729,611

[22] Filed: Oct. 11, 1996

[51] Int. Cl.$^6$ ................ H03D 1/04; H04L 25/08
[52] U.S. Cl. .................. 375/346; 375/341; 375/350
[58] Field of Search .................. 375/265, 285, 375/345, 341, 229, 230, 231, 262, 346, 350, 362; 348/607, 665; 455/307, 296; 330/254

[56] References Cited

U.S. PATENT DOCUMENTS

| | | | |
|---|---|---|---|
| 4,583,090 | 4/1986 | Eden et al. | 340/825.07 |
| 5,396,657 | 3/1995 | Jokinen | 455/307 |
| 5,453,797 | 9/1995 | Nicolas et al. | 348/607 |
| 5,594,496 | 1/1997 | Nielsen et al. | 348/607 |
| 5,600,677 | 2/1997 | Citta et al. | 375/296 |
| 5,602,602 | 2/1997 | Hulyalkar | 348/607 |
| 5,604,541 | 2/1997 | Kim et al. | 348/426 |
| 5,619,534 | 4/1997 | Hulyalkar | 375/285 |
| 5,636,252 | 6/1997 | Patel et al. | 375/345 |

*Primary Examiner*—Tesfaldet Bocure

[57] ABSTRACT

A receiver for decoding encoded data transmitted by a transmitting station includes (i) sum and difference filters for filtering the encoded data and for providing corresponding sum and difference filtered outputs, (ii) first and second variable gain amplifiers for respectively controlling the sum and difference filtered outputs so as to provide corresponding sum and difference controlled filtered outputs that vary along a continuum in order to suppress co-channel interference and white Gaussian noise in the encoded data, and (iii) a Viterbi decoder for decoding the sum and difference controlled filtered outputs to recover uncoded data.

37 Claims, 8 Drawing Sheets

DECODER FOR A TRELLIS ENCODED SIGNAL CORRUPTED BY NTSC CO-CHANNEL INTERFERENCE AND WHITE NOISE

TECHNICAL FIELD OF THE INVENTION

The present invention relates to decoding of a trellis encoded signal corrupted with colored noise.

BACKGROUND OF THE INVENTION

A current implementation of an 8 VSB receiver for HDTV relies upon a switchable comb filter in order to reject co-channel interference, such as co-channel NTSC interference, that may be present, for example, in the fringe reception areas of an ATV service area. Thus, when co-channel NTSC interference is detected, the comb filter is made active (i.e., switched in) in order to filter out the co-channel NTSC interference. When the comb filter is active, decoding of the received data is more complex than when the comb filter is inactive. Accordingly, when co-channel NTSC interference is not detected, the comb filter is made inactive (i.e., switched out) in order to provide optimum performance against white Gaussian noise. The comb filter has been shown to be a cost effective filter for the rejection of co-channel NTSC interference.

The use of such a switchable comb filter, however, has several drawbacks. First, while the comb filter is good at rejecting co-channel NTSC interference, the presence of the comb filter degrades performance when white Gaussian noise is present. Accordingly, when only co-channel NTSC interference is present, the comb filter is an effective filter. When only white Gaussian noise is present, however, the comb filter is made inactive. When both co-channel NTSC interference and white Gaussian noise are present, the comb filter is active such that a substantial amount of white Gaussian noise is allowed to pass. Thus, the comb filter may not be an appropriate filter under conditions of both co-channel NTSC interference and white Gaussian noise.

An additional drawback of the comb filter is that it is a switchable filter such that it is either active or inactive. The control circuitry that has been developed which determines when to switch the comb filter in or out is complicated and can make incorrect decisions.

The present invention is directed to an adaptive decoder that adjusts appropriately to the relative amounts of co-channel NTSC interference and white Gaussian noise. Thus, the present invention achieves good performance under conditions of both co-channel NTSC interference and white Gaussian noise.

SUMMARY OF THE INVENTION

In accordance with one aspect of the present invention, a receiver for decoding noisy encoded data received from a transmitting station comprises a filtering means and a decoding means. The filtering means variably filters co-channel interference and noise in the encoded data dependent upon relative amounts of co-channel interference and noise in the encoded data. The decoding means decodes the filtered encoded data.

In accordance with another aspect of the present invention, a receiver for decoding noisy encoded data transmitted by a transmitting station comprises first and second filters and a decoding means. The first filter has an input to receive the encoded data, the first filter is a difference filter, and the first filter has a first output to provide first filtered encoded data corresponding to a difference between the encoded data and delayed encoded data. The second filter has an input to receive the encoded data, the second filter is a sum filter, and the second filter has a second output to provide second filtered encoded data corresponding to a sum of the encoded data and the delayed encoded data. The decoding means decodes the first and second filtered encoded data.

In accordance with yet another aspect of the present invention, a receiver for decoding encoded data transmitted by a transmitting station comprises first and second filtering means, a controlling means, and a decoding means. The first and second filtering means filter the encoded data and provide corresponding first and second filtered outputs. The controlling means relatively controls the first and second filtered outputs so as to provide corresponding first and second relatively controlled filtered outputs in order to suppress co-channel interference and noise in the encoded data. The decoding means decodes the first and second relatively controlled filtered outputs.

BRIEF DESCRIPTION OF THE DRAWINGS

These and other features and advantages of the present invention will become more apparent from a detailed consideration of the invention when taken in conjunction with the drawings in which.

DETAILED DESCRIPTION

Figure 1:
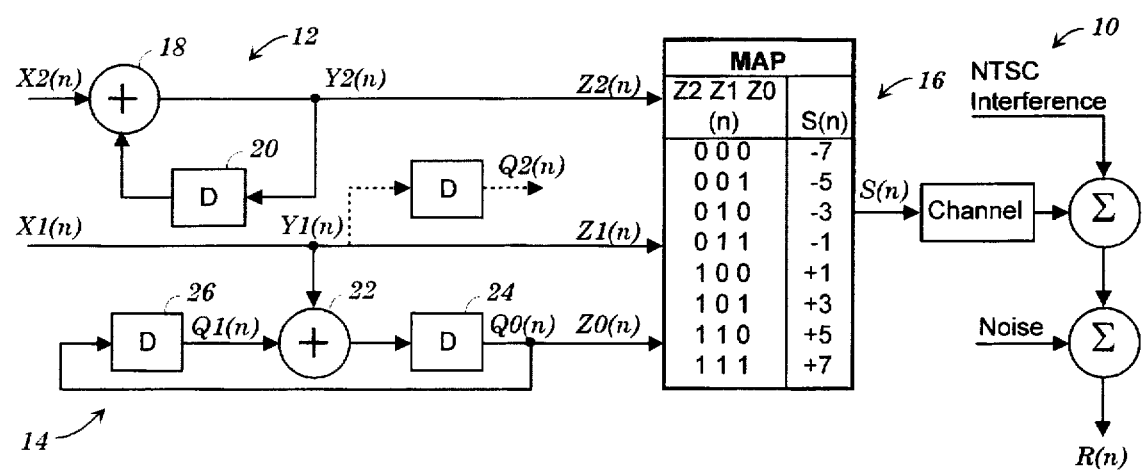
FIG. 1 illustrates an example of a prior art precoder and trellis encoder which encodes data to be decoded by the present invention.

FIG. 1 illustrates an encoder 10 which may be, for example, an 8 VSB encoder. The encoder 10 includes a precoder 12, a trellis encoder 14, and a symbol mapper 16. The precoder 12 includes an adder 18 and a D bit delay element 20. The value "D" is chosen to match the delay of the interference rejecting comb filter which is present in the receiver. The adder 18 is a MOD-2 adder. The adder 18 receives a first input data bit X2(n) of a data bit pair X2X1(n) and sums this first input data bit X2(n) with the output of the adder 18 that occurred D bits earlier. The output of the adder 18 forms the intermediate bit Y2 (n) which is provided as output bit Z2(n) to the symbol mapper 16. The function (n) denotes that an associated value is at discrete time n.

A second input data bit X1(n) of the data bit pair X2X1(n) is provided to the trellis encoder 14 which includes an adder 22 and two D bit delay elements 24 and 26. The adder 22 is a MOD-2 adder. The trellis encoder 14 provides the second input data bit X1(n) as output bit Z1(n) directly to the symbol mapper 16. The second input data bit X1(n) is also provided to a first input of the adder 22 of the trellis encoder 14. The output of the adder 22 is connected to the D bit delay element 24. The D bit delay element 24 delays the output of the adder 22 and supplies this delayed output as the output bit Z0(n) to the symbol mapper 16. The delayed output of the D bit delay element 24 is also connected back to the D bit delay element 26. The output of the D bit delay element 26 is connected to a second input of the adder 22. Accordingly, the input data bits X1(n) and X2(n) of the bit pair X2X1(n) enter the encoder 10. The encoder 10 (i) differentially encodes the input data bit X2(n) as the output bit Z2(n), (ii) passes the input data bit X1(n) through as output bit Z1(n) without modification, and (iii) convolutionally encodes the input data bit X1(n) as the output bit Z0 (n).

The symbol mapper 16 maps each set of output bits Z2Z1Z0(n) as a corresponding symbol S(n). Each symbol S(n) can have, therefore, one of eight possible signal levels. The symbols S(n) are then transmitted in a conventional manner through a transmission channel where they may pick up co-channel NTSC interference and white Gaussian noise before they are received by a receiver as received symbols R(n).

The D bit delay elements 20, 24, and 26 shown in FIG. 1 represent, for example, twelve bit time delays (i.e., D is twelve). As described above, the information bits X2X1(n) are differentially and convolutionally encoded as symbols. These symbols are spaced by multiples of D (where D may be, for example, twelve). Accordingly, the encoded bit stream, in effect, consists of twelve independently encoded data streams. A decoder must decode these encoded data streams independently of each other.

FIG. 1 also includes a supplemental state variable Q2(n) which represents the previous value of Y1(n) such that Q2(n)=Y1(n−D). The value Q2(n) does not actually exist in the encoder 10 and it does not impact the operation of the encoder 10. The value Q2(n) is merely a convenient notation for the subsequent description of the present invention.

A receiver, which includes a Viterbi decoder 28, a switch 30, and a comb filter 32, receives the transmitted symbols R(n). The Viterbi decoder 28 decodes the received symbols R(n) to recover the original bit pair X2X1(n). The switch 30 detects the presence of co-channel NTSC interference. If co-channel NTSC interference is present, the switch 30 moves to its upper position in order to connect the comb filter 32 to the Viterbi decoder 28 so that the comb filter 32 filters the received symbols R(n).

The comb filter 32 includes a summer 34 and a D symbol delay element 36. The summer 34 has a first input which receives the symbols R(n) directly and a second input which receives the symbols R(n) delayed by D symbol times. The value of D determines the position and quantity of the notches that the comb filter places in the passband. A choice of D=12 yields a set of notches that are near the interfering NTSC visual, chroma, and aural carriers. If the D symbol delay element 36 is a twelve symbol delay element, the D bit delay elements 20, 24, and 26 of FIG. 1 are twelve bit delay elements.

If co-channel NTSC interference is not detected by the receiver, the switch 30 moves to its lower position, where the received symbols R(n) are connected directly to the Viterbi decoder 28.

Figure 2:
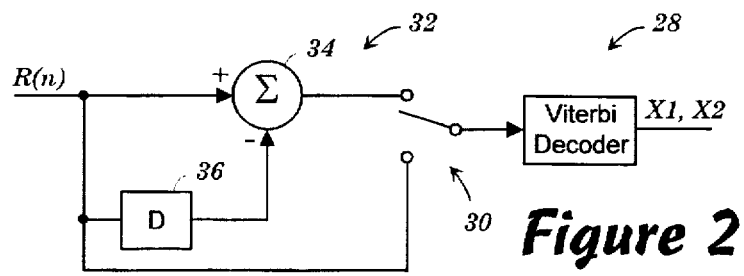
FIG. 2 illustrates an example of a prior art comb filter and Viterbi decoder for filtering and decoding data typically encoded by the precoder and trellis encoder of FIG. 1.

Although the comb filter 32 shown in FIG. 2 is effective at rejecting co-channel NTSC interference, its performance is poor when both co-channel NTSC interference and white Gaussian noise are present. Furthermore, the circuitry that determines when to actuate the switch 30 to switch in the comb filter 32 is complicated and can occasionally make an incorrect decision.

Figure 3:
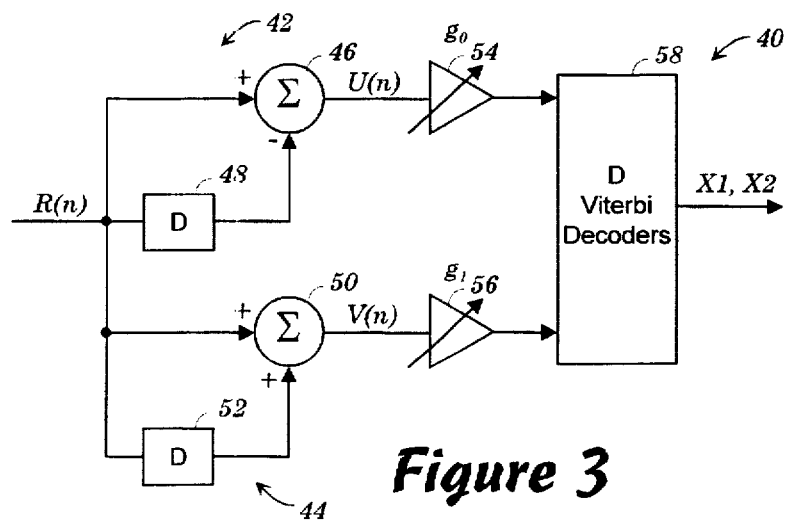
FIG. 3 illustrates a filter and decoder according to the present invention for filtering and decoding data typically encoded by the precoder and trellis encoder of FIG. 1.

A decoder 40 of FIG. 3 is more effective in rejecting both co-channel NTSC interference and white Gaussian noise, does not require a switching decision, and does not add appreciably to the complexity of the receiver. The decoder 40 includes a first filter 42 and a second filter 44. The first filter 42, which is a difference filter, includes a summer 46 having a first input which receives the received symbols R(n) directly, and a second input for receiving the received symbols R(n) through a D symbol delay element 48. The D symbol delay element 48 may impose a twelve symbol delay on the received symbols R(n). The second filter 44, which is a sum filter, includes a summer 50 having a first input which receives the received symbols R(n) directly, and a second input for receiving the received symbols R(n) through a D symbol delay element 52. The D symbol delay element 52 may also impose a twelve symbol delay on the received symbols R(n).

The difference output of the first filter 42 is designated U(n), and the sum output of the second filter 44 is designated V(n). The difference output U(n) represents the difference between a symbol and a corresponding symbol which, because of the D symbol delay element 48, occurred D symbols earlier, such that U(n)=R(n)−R(n−D). Similarly, the sum output V(n) represents the sum of a symbol and a corresponding symbol which, because of the D symbol delay element 52, occurred D symbols earlier, such that V(n)=R(n)+R(n−D). The difference output U(n) is processed through a first variable gain amplifier 54, and the sum output V(n) is processed through a second variable gain amplifier 56. The first variable gain amplifier 54 has a gain $g_0$, and the second variable gain amplifier 56 has a gain $g_1$. Thus, the output of the first variable gain amplifier 54 is $g_0U(n)$, and the output of the second variable gain amplifier 56 is $g_1V(n)$. The outputs of the first variable gain amplifier 54 and of the second variable gain amplifier 56 are connected to a bank of D Viterbi decoders 58. Each of the Viterbi decoders of the bank of D Viterbi decoders 52 decodes one of the time interleaved encoded streams using the outputs $g_0U(n)$ and $g_1V(n)$ in order to recover the corresponding input bit pair X2X1(n).

The symbols R(n) which enter the decoder 40 may be corrupted by additive noise. The decoder 40 filters the symbols R(n) with the first and second filters 42 and 44 to yield the difference and sum outputs U(n) and V(n). The first and second variable gain amplifiers 54 and 56 apply the corresponding gains $g_0$ and $g_1$ to the difference and sum outputs U(n) and V(n) in order to produce the outputs $g_0$U(n) and $g_1$V(n). The bank of D Viterbi decoders 58 extracts the information bits X1/X2(n) from the outputs $g_0$U(n) and $g_1$V(n). The first filter 42 and the second filter 44 may be either before or after the usual equalizer and phase tracker (not shown) which are conventional in an 8 VSB receiver.

As previously discussed, each symbol, which results from mapping the output bits Z2Z1Z0(n), can take on one of eight possible signal levels independently of any other symbol. When two symbols (a symbol R(n) just received and a symbol R(n−D) which was received D symbol times before) are processed together by a comb filter, a sixtyfour point two-dimensional constellation, which is illustrated, by way of example, in FIG. 4, results. The symbol R(n) just received is shown along the horizontal axis of FIG. 4, and the previously received symbol R(n−D) is shown along the vertical axis. Because each of these two symbols can take on eight possible levels, the combination of these two symbols processed together results in sixtyfour possible points as shown in FIG. 4.

When the received symbols R(n) are corrupted only by white Gaussian noise, the white Gaussian noise is independent from sample-to-sample. Hence, the distribution around each of the constellation points shown in FIG. 4 because of white Gaussian noise is circularly symmetric. (That is, if the symbols are paired in the manner described above and viewed on an oscilloscope, the points would be fuzzy circles.)

When the received symbols R(n) are corrupted only by co-channel NTSC interference, the co-channel NTSC interference is not independent from sample-to-sample and, in fact, there is a high correlation between symbols spaced by twelve symbol times. Hence, the distribution around each of the constellation points shown in FIG. 4 because of co-channel NTSC interference is elliptical and has a major axis aligned along the line defined by the equation R(n−D) =R(n).

Figure 4:
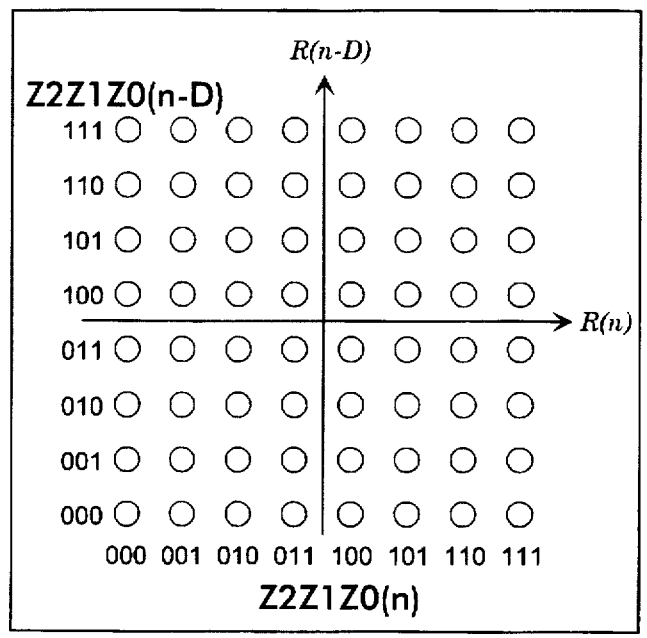
FIG. 4 is a composite constellation for successive encoded data points and is useful in explaining the present invention.

When the received symbols R(n) are corrupted by both co-channel NTSC interference and white Gaussian noise, the distribution around each of the constellation points shown in FIG. 4 varies between elliptical and circular according to these relative amounts of co-channel NTSC interference and white Gaussian noise.

Figure 5:
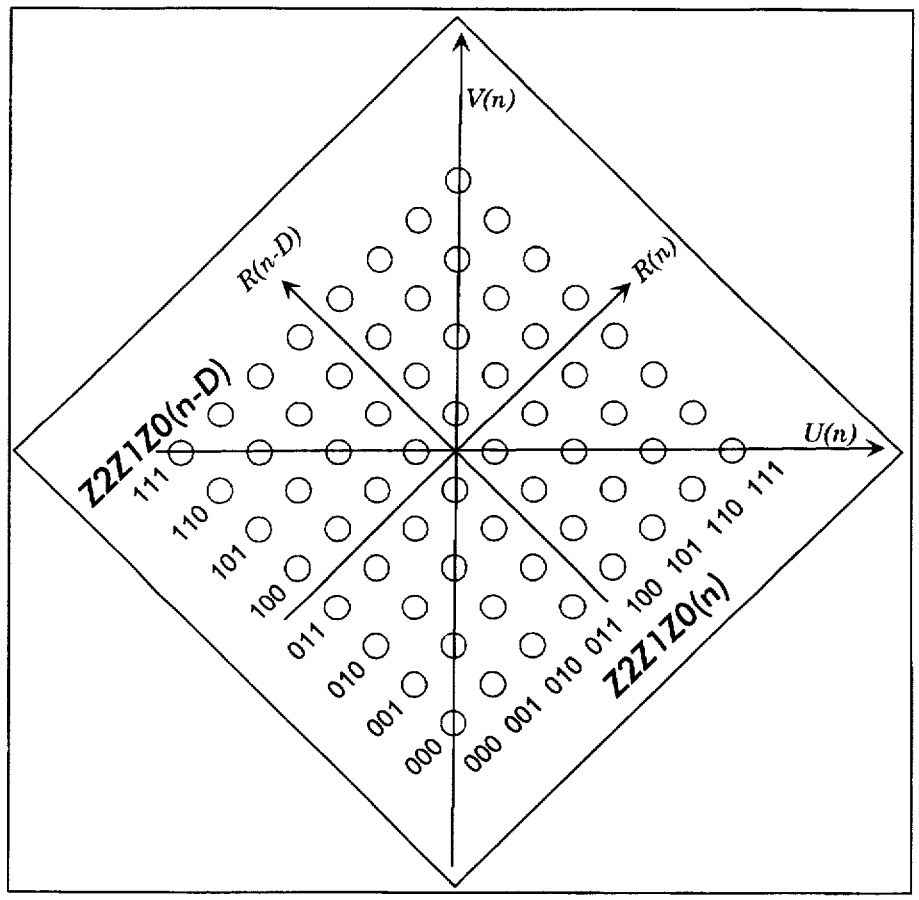
FIG. 5 is the composite constellation of FIG. 4 which has been rotated in accordance with the principles of the present invention.

Because of the first filter 42 and the second filter 44 of FIG. 3, the sixty-four point two-dimensional constellation of FIG. 4 is rotated counterclockwise by 45° to a new coordinate system as shown in FIG. 5. The difference output U(n) is now along the horizontal axis, and the sum output V(n) is along the vertical axis. The decoding algorithm described herein operates directly using this rotated two-dimensional constellation. It should be noted that the techniques described here are different from multi-dimensional trellis coding because the transmitted signal is encoded as a one-dimensional constellation. The two-dimensional constellation arises in this technique by forming (overlapping) pairs of transmitted symbols in the receiver.

The counterclockwise rotation of the sixty-four point two-dimensional constellation of FIG. 4 to the new coordinate system shown in FIG. 5 is fortuitous because co-channel NTSC interference has also been rotated by the same amount so that its major axis lies along the vertical axis. That is, such a rotation is useful because, if there is co-channel NTSC interference present, the decoder 40 should put less weight on errors in the V direction because such errors are known to be noisy. Additionally, if only white Gaussian noise is present, the noise distribution is circularly distributed and consequently equal weight should be given by the decoder 40 to errors in both the U(n) and V(n) dimensions. Thus, the function of the gains $g_0$ and $g_1$ is to appropriately weight the errors at the outputs of the first and second filters 42 and 44 according to the changing co-channel NTSC interference and white Gaussian noise conditions in order to put the correct weight on the errors in each of the U(n) and V(n) dimensions.

Both of the gain values $g_0$ and $g_1$ are adjusted in order to react to the co-channel NTSC interference and white Gaussian noise statistics. Alternatively, the gain value $g_0$ may be fixed to unity and the gain value $g_1$ may be adjusted between 0.0 and 1.0 dependent upon the relative amounts of co-channel NTSC interference and white Gaussian noise. This simplification is appropriate in those cases where only co-channel NTSC interference and white Gaussian noise is assumed. If the interference is a more general continuous wave interference having unknown frequency or frequencies, then adjustment of both gains is appropriate.

Figure 6:
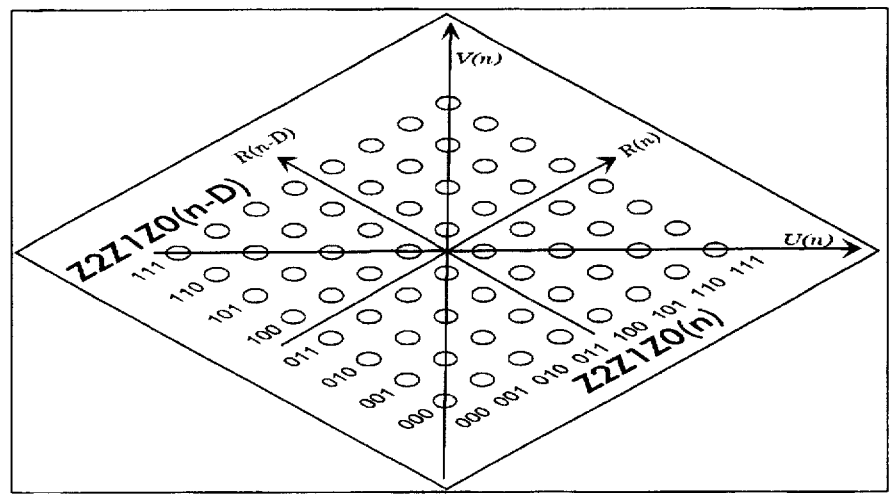
FIG. 6 is the rotated composite constellation of FIG. 5 showing the effect of reduced gain along the V(n) axis in accordance with the principles of the present invention.

FIG. 6 illustrates the impact that a change in the gain value $g_1$ has on the sixty-four point two-dimensional constellation shown in FIG. 5. As the gain value $g_1$ is reduced below 1.0, the sixty-four point two-dimensional constellation is compressed in the V dimension. At the optimal value of $g_1$, interference around each point in the sixty-four point two-dimensional constellation is equal in both dimensions, and the branch metrics of the bank of D Viterbi decoders 58 are based upon the distances of the point UV(n) to each point in the compressed constellation.

Figure 7:
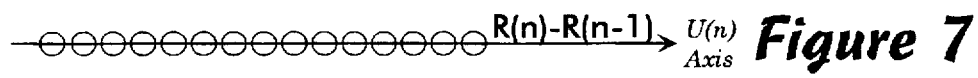
FIG. 7 is the rotated composite constellation of FIG. 5 showing the effect of zero gain along the V(n) axis in accordance with the principles of the present invention.

As the gain value $g_1$ is reduced to zero, all points in the sixty-four point two-dimensional constellation are projected onto the U(n) axis as shown as FIG. 7. Accordingly, the sixty-four point two-dimensional constellation is condensed to a fifteen point one-dimensional constellation. Under this condition, the bank of D Viterbi decoders 58 makes its decisions based solely upon the output of the first filter 42.

Figure 8:
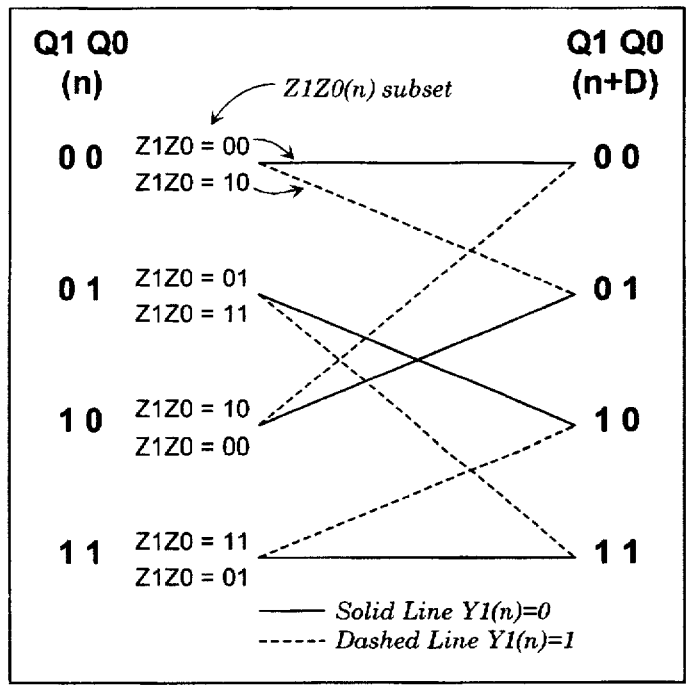
FIG. 8 illustrates a trellis encoder diagram which is descriptive of the operation of the trellis encoder of FIG. 1.

The trellis encoder diagram of FIG. 8 describes the convolutional encoding process performed by the trellis encoder 14 of FIG. 1. The trellis encoder diagram of FIG. 8 shows the current state of the trellis encoder 14 in column Q1Q0(n) and the resultant next state of the trellis encoder 14 in column Q1Q0(n+D). The transition from a state in column Q1Q0(n) to a state in column Q1Q0(n+D) depends upon the intermediate data bit Y1(n). The label Z1Z0(n) in FIG. 8 shows which of the four subsets (00, 01, 10, and 11) is transmitted as a symbol. For example, if the current state of the trellis encoder 14 is such that Q1Q0(n)=00, and if Y1(n) is 0, then Z1(n) is 0 because Y1(n) is 0, Z0(n) is 0 because Q0(n) is 0, and Q1Q0(n+D) becomes 00. On the other hand, if the current state of the trellis encoder 14 is such that Q1Q0(n)=00, and if Y1(n) is 1, then Z1(n) is 1 because Y1(n) is 1, Z0(n) is 0 because Q0(n) is 0, and Q1Q0(n+D) becomes 01.

The eight points of the constellation selected by the combinations of the Z2Z1Z0(n) bits are partitioned into four subsets, where each subset has the same Z1Z0(n) bits. For example, the subset Z1Z0(n)=00 contains the points Z2Z1Z0(n)=000 and 100. The selection between these two points in the subset Z1Z0(n)=00 for transmission is determined by the uncoded bit Z2(n) and is not shown in FIG. 8. However, as is known, if Z2(n) is zero, the point Z2Z1Z0(n) =000 is selected and, if Z2(n) is one, the point Z2Z1Z0(n) =100 is selected.

Figure 9:
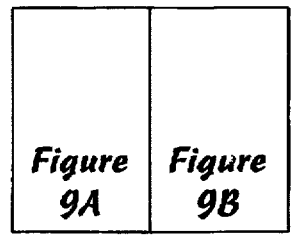
FIG. 9 illustrates the subset constellations implemented by the Viterbi decoder of FIG. 3.
Figure 9A:
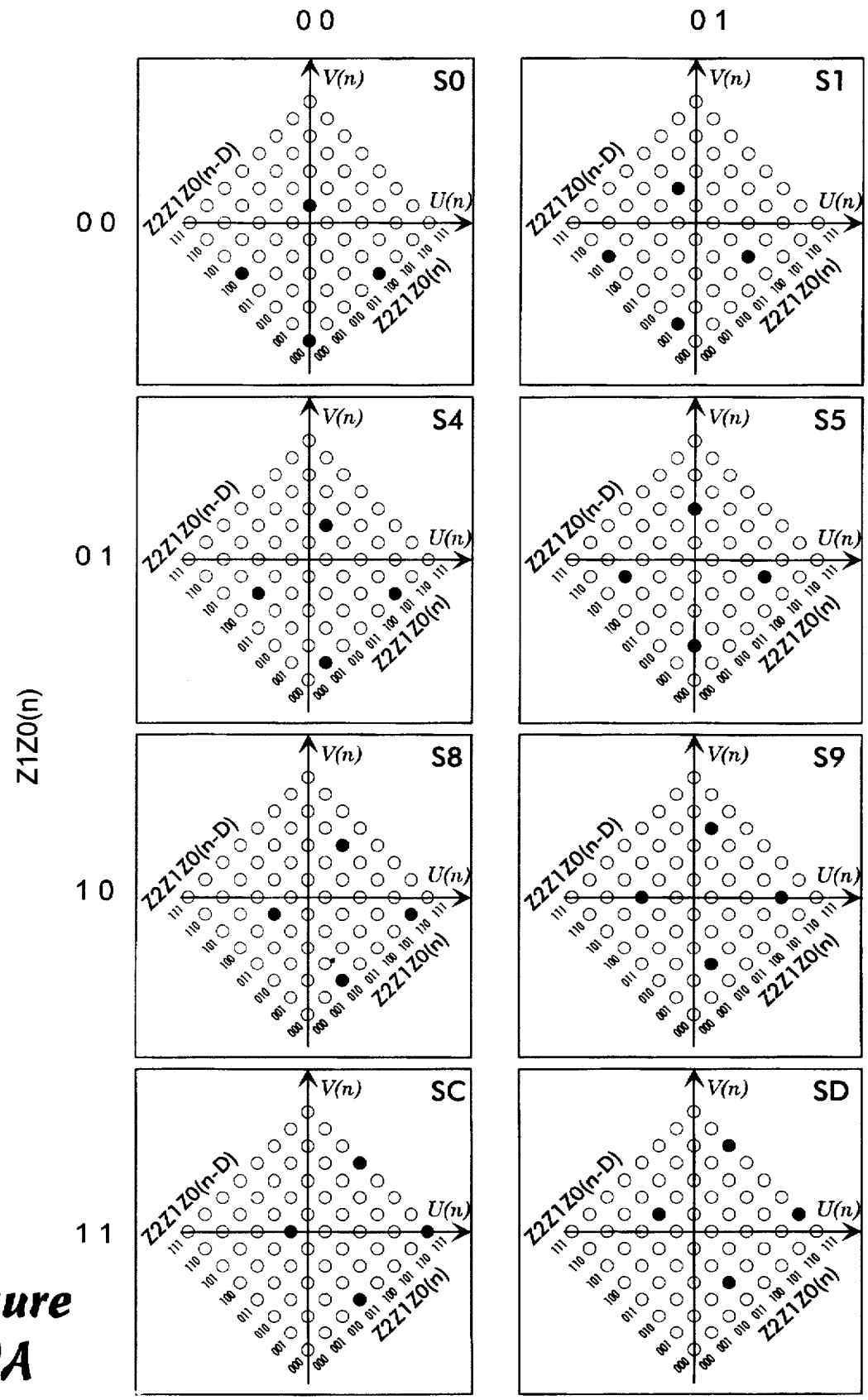
Figure 9B:
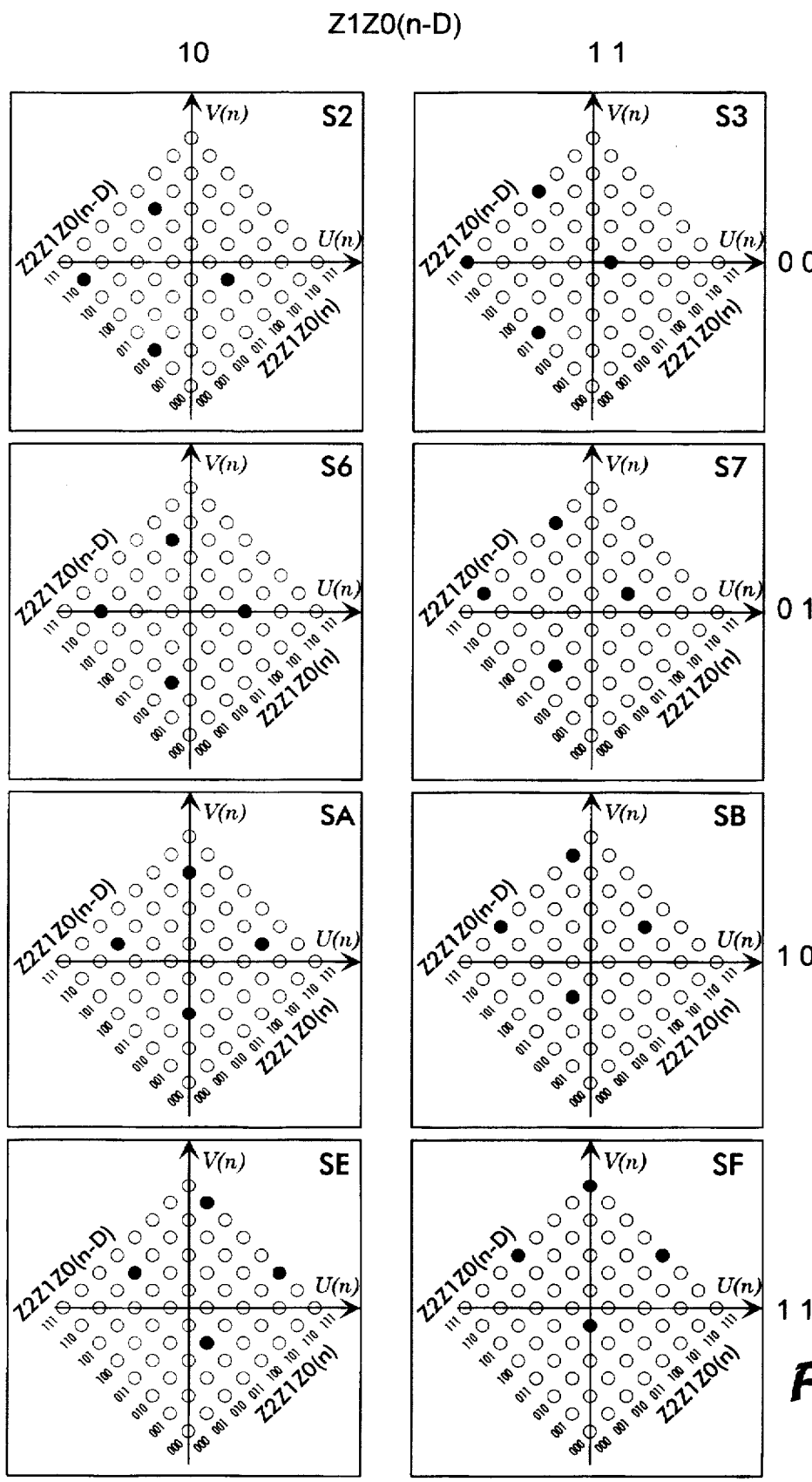

The bank of D Viterbi decoders 58 (FIG. 3) performs its decoding operation using the outputs $g_0$U(n) and $g_1$V(n) of the corresponding first and second filters 42 and 44 based upon the sixteen subsets shown in FIG. 9 of the sixty-four point two-dimensional constellation. The sixteen subsets shown in FIG. 9 are defined by the sixteen possible combinations of the Z1Z0 output bits for two symbol times n and n–D. The four rows of FIG. 9 correspond to Z1Z0(n)=00, 01, 10, and 11, and the four columns of FIG. 9 correspond to Z1Z0(n–D)=00, 01, 10, and 11. The subsets are labelled in the upper right hand corner as S0, S1, S2, . . . SF according to the hexadecimal representation of bits Z1(n), Z0(n), Z1(n–D), and Z0(n–D).

The sixteen subsets shown in FIG. 9 form all of the possible combinations of subsets that can occur between two symbols. There are four subsets possible for the current symbol [Z1Z0(n)], and there are four subsets possible for the previous symbol [Z1Z0(n–D)]. For example, if the previous subset is Z1Z0(n–D)=01 and the current subset is Z1Z0(n)=10, then the output UV(n) of the first and second filters 42 and 44 must lie in subset S9 of the sixteen two-dimensional constellations.

Figure 10:
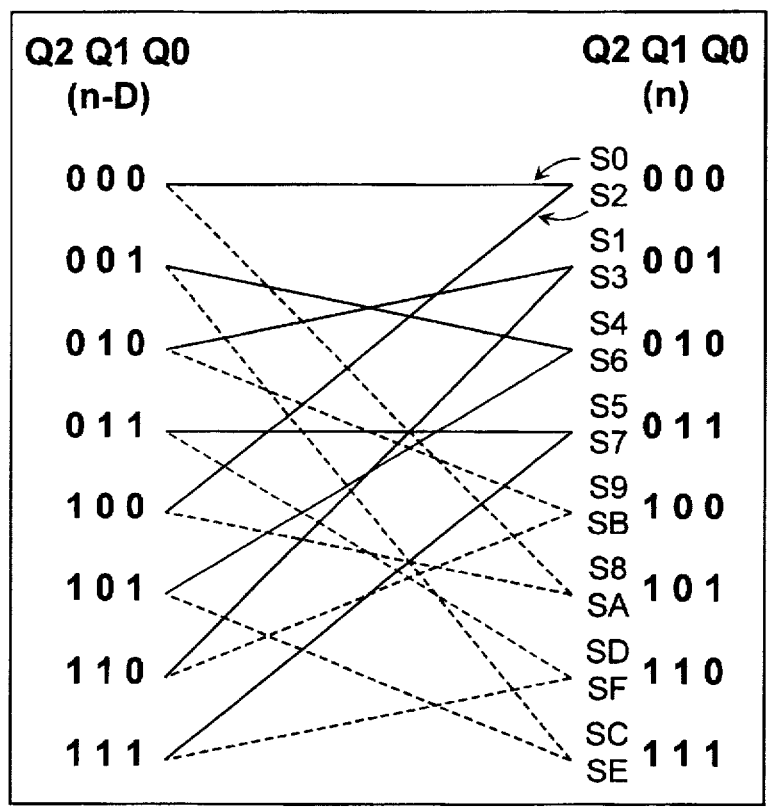
FIG. 10 illustrates a trellis decoder diagram which is descriptive of the operation of the Viterbi decoder of FIG. 3.

The bank of D Viterbi decoders 58 performs decoding according to the subsets shown in FIG. 9 and the trellis decoder diagram shown in FIG. 10. This trellis decoder diagram is constructed by using the trellis encoder diagram of FIG. 8 augmented with the state variable Q2(n) and the subsets of FIG. 9. This trellis decoder diagram of FIG. 10 may be used by the bank of D Viterbi decoders 58 in determining which of the sixteen subsets results for each state transition (the state transition is defined by the state Q2Q1Q0(n–D) of the encoder 10). Accordingly, the bank of D Viterbi decoders 58 has eight states, with each state corresponding to the Q2Q1Q0 state bits of the encoder 10 shown in FIG. 1. The state bit Q2 is simply used as bookkeeping to keep track of the value of the previous input data bit Y1(n–D). Accordingly, FIG. 10 shows the state transitions and associated subsets S0-SF of the data that the bank of D Viterbi decoders 58 receives. Using the trellis decoding diagram of FIG. 10, the bank of D Viterbi decoders 58 decodes the signals $g_0 U(n)$ and $g_1 V(n)$ in its normal fashion with the bank of Viterbi decoders 58 generating branch metrics for each subset S0-SF, using these branch metrics to update an accumulated path metric for each decoder state, and maintaining a survivor path associated with each state. The survivor path having the lowest path metric is the path that gives the decoded information bit X1(n) and the associated subset (S0-SF). Generation of the branch metrics performed by the bank of D Viterbi decoders 58 is done by measuring the distances between each received point ($g_0 U(n)$, $g_1 V(n)$) and the points in each subset of FIG. 9 with each of these subsets scaled by the gains $g_0$ and $g_1$ in the U(n) axis and the V(n) axis, respectively. Alternatively, the branch metrics may be computed by directly measuring the distance between the received point ($g_0 U(n)$, $g_1 V(n)$) prior to scaling and each point in the subsets of FIG. 9 and by applying the gains $g_0$ and $g_1$ to the U and V distance measurements appropriately.

Figure 11:
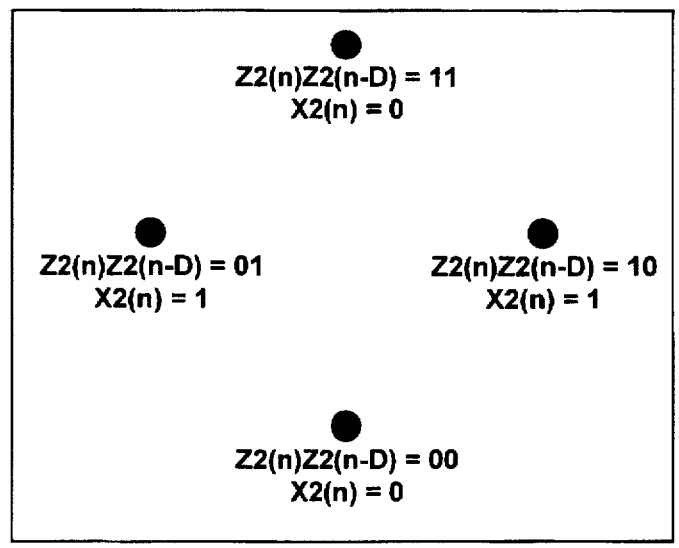
FIG. 11 illustrates a diagram which is descriptive of the decoding of the uncoded bit by the Viterbi decoder of FIG. 3.

As shown in FIG. 9, each of the two-dimensional subsets contains four points. Once the bank of D Viterbi decoders 58 has determined which subset the transmitted point lies in, the bank of D Viterbi decoders 58 uses that subset in order to find the differentially encoded information bit X2. Which one of the four points in this subset that is received is determined by the bit Z2 (FIG. 1) for the consecutive symbol pair Z2(n)Z2(n–D). The decoding of the information bit X2 is performed according to which of the four points in the subset the received point $g_0 U(n) g_1 V(n)$ is nearest. The four points of an arbitrary subset and the Z2(n)Z2(n–D) bit values that correspond to each point are shown in FIG. 11. The four possible permutations of the Z2(n)Z2(n–D) bits uniquely identify the point within a subset. Thus, the decoding of the information bit X2 is performed by determining which Euclidean distance between the received point $g_0 U(n) g_1 V(n)$ and the four points Z2(n)Z2(n–D) of the subset is shortest. The point Z2(n)Z2(n–D) which is closest to the received point $g_0 U(n) g_1 V(n)$ determines the bit X2(n) according to the labelling shown in FIG. 11.

Because of the differential encoding of the bit X2, the upper and lower points both have a label X2(n)=0 and the left and right points both have a label X2(n)=1. Accordingly, if one of the gain values $g_0$ or $g_1$ is reduced to zero, the differentially encoded bit can still be determined. For example, if $g_1$=0, then the Z2(n)Z2(n–D)=11 and 00 points merge to a single point. On the other hand, if $g_0$=0, then the Z2(n)Z2(n–D)=01 and 10 points merge to a single point. Fortunately, in each case, each of the merged points has the same corresponding X2(n) value. As a result, the decoding of the X2 bit is performed correctly by the bank of D Viterbi decoders 58 without catastrophic error propagation.

Figures 12, 13:
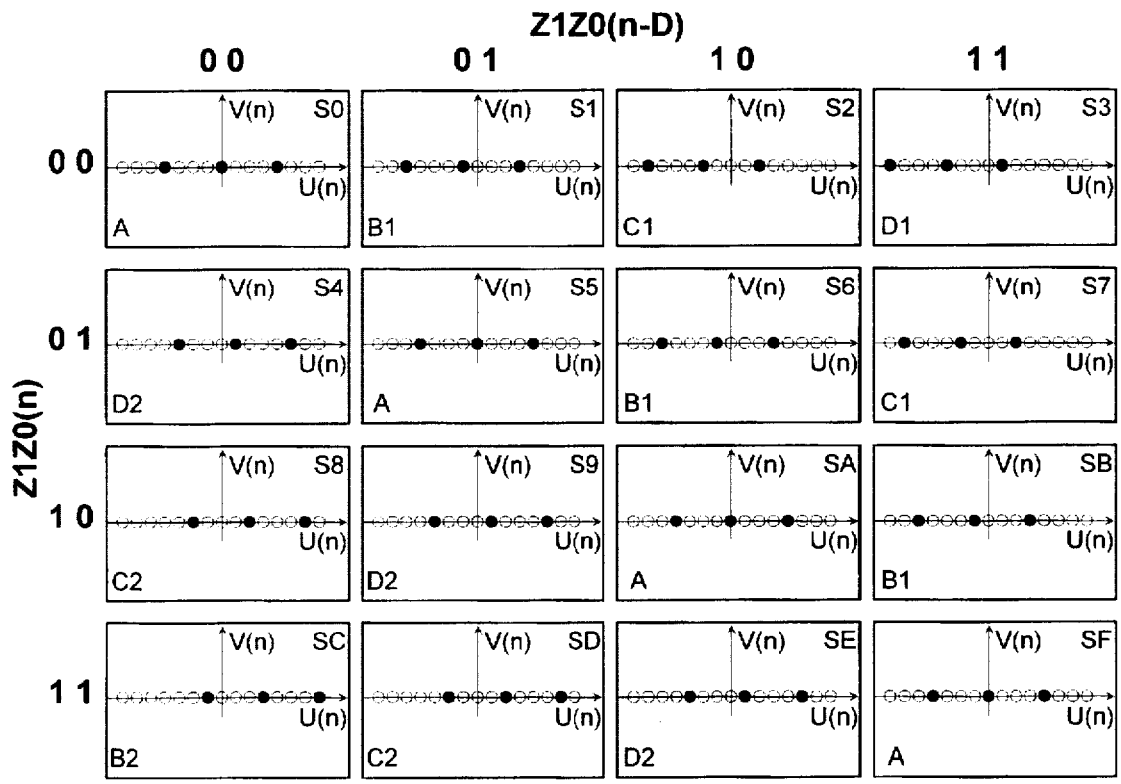
FIG. 12 illustrates the impact on the FIG. 9 subset constellations when the gain along the V(n) axis is set to zero.
FIG. 13 illustrates a simplification of the subset constellations of FIG. 12; and, FIG. 14 illustrates an apparatus which may be implemented in order to determine the gains for the variable gain amplifiers of FIG. 3.

When the gain parameter $g_1$ is reduced to zero, the bank of D Viterbi decoders 58 operates solely on the difference filter output U(n). FIG. 12 shows the impact on the sixteen two-dimensional subsets as the gain $g_1$ is set to zero. The subsets S0-SF merge into one-dimensional constellations. Accordingly, as can be seen from FIG. 12, there are only seven unique subsets which are labeled (in the lower left hand corner) A, B1, B2, C1, C2, D1, and D2 in FIG. 12. FIG. 13 shows the seven subsets of the comb filter output constellation. Thus, FIGS. 12 and 13 show that, when the first filter 42 is acting alone (without the second filter 44), the bank of D Viterbi decoders 58 operates identically to the procedure disclosed in U.S. patent application Ser. No. 08/272,181 filed on Jul. 8, 1994.

Thus, the gain values $g_0$ and $g_1$ may be adjusted along a continuum from 0.0 to 1.0 depending upon the relative amount of co-channel NTSC interference and white Gaussian noise present in the received symbols R(n). Consequently, instead of merely switching the first filter 42 in and out depending upon the amount of co-channel NTSC interference present, the first filter 42 and the second filter 44 are relatively adjusted depending upon the relative amounts of co-channel NTSC interference and Gaussian noise.

Figure 14:
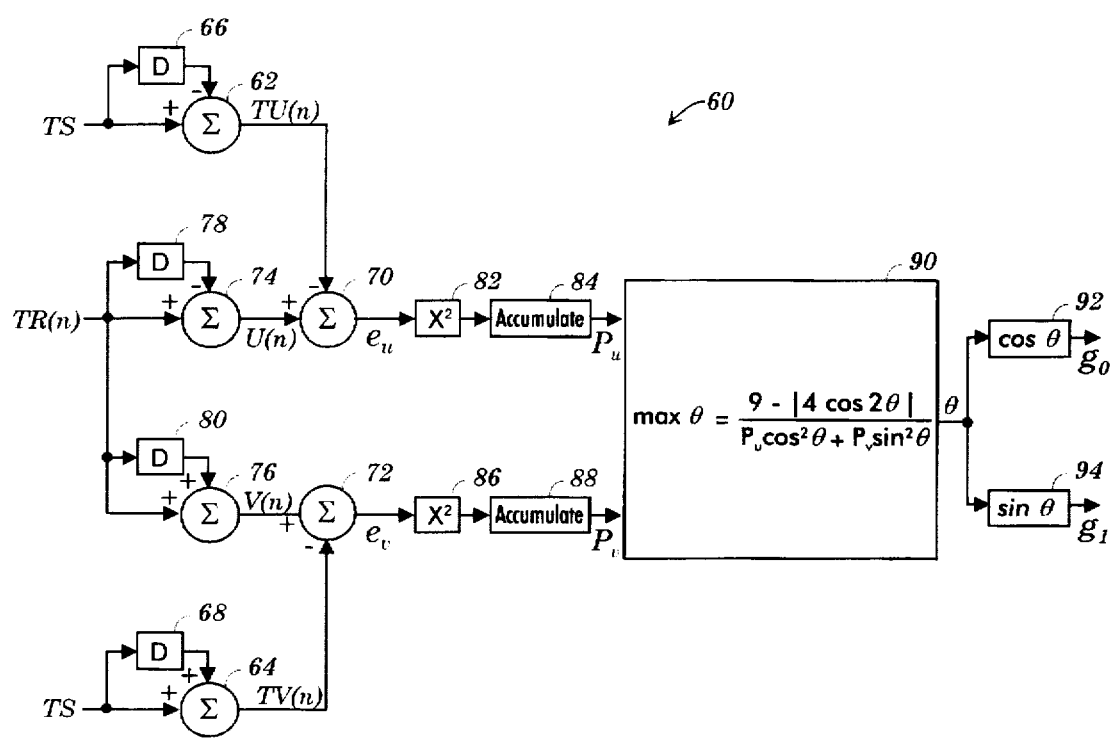

FIG. 14 illustrates a gain setting arrangement 60. The gain setting arrangement 60 sets the gain values $g_0$ and $g_1$ by measuring the interference and noise present in a training signal which is periodically transmitted and which is received as a received training signal TR(n). The training signal, before transmission, is identical to an ideal reference training signal TS. The training signal is generated by a transmitter and is transmitted to the receiver which contains the decoder 40 and which receives the received training signal TR(n). Along the transmission path between the transmitter and the receiver, the transmitted training signal picks up any co-channel NTSC interference and white Gaussian noise that is present between the transmitter and the receiver. The ideal reference training signal TS is generated locally by the receiver.

The ideal reference training signal TS is supplied to first and second summers 62 and 64 directly and also to the first and second summers 62 and 64 through corresponding D symbol delay elements 66 and 68. The output of the first summer 62, TU(n), represents the difference between the reference training signal TS(n) and the delayed reference training signal TR(n–D). Accordingly, the output of the first summer 62, TU(n), represents the ideal output U(n). The output of the second summer 64, TV(n), represents the sum of the reference training signal TS(n) and the delayed reference training signal TS(n–D). Accordingly, the output of the first summer 62, TV(n), represents the ideal output V(n). The outputs of the first and second summers 62 and 64 are supplied to corresponding third and fourth summers 70 and 72.

The received training signal TR(n) is supplied directly to fifth and sixth summers 74 and 76 and is also supplied indirectly to the fifth and sixth summers 74 and 76 through corresponding D symbol delay elements 78 and 80. The output of the fifth summer 74 represents the difference between the received training signal TR(n) and the delayed received training signal TR(n–D). The output of the sixth summer 76 represents the sum of the received training signal TR(n) and the delayed received training signal TR(n–D). The output of the fifth summer 74 is supplied to the third summer 70, and the output of the sixth summer 76 is supplied to the fourth summer 72.

The error $e_U$ from the third summer 70 represents interference and noise along the U(n) axis picked up by the transmitted training signal along the transmission path. The error $e_U$ is squared by a squarer 82 and is accumulated by an accumulator 84 so as to produce a signal $P_U$ which represents the average power of the interference and noise represented by the error $e_U$. The error $e_V$ from the fourth summer 62 represents interference and noise picked up by the transmitted training signal along the transmission path. The error $e_V$ is squared by a squarer 86 and is accumulated by an accumulator 88 so as to produce a signal $P_V$ which represents the average power of the interference and noise represented by the error $e_V$.

The average powers $P_U$ and $P_V$ are supplied to a block 90 which determines a parameter $\theta$. The parameter $\theta$ is supplied to a block 92 which determines the weighting of $g_0$ as $g_0=\cos\theta$ and to a block 94 which determines the weighting of $g_1$ as $g_1=\sin\theta$. As $\theta$ varies from 0 to $\pi/2$, the minimum distance of the trellis code changes according to the following equation:

$$d_{min}^2(\theta)=9-4\cos 2\theta \text{ for } 0\leq\theta\leq\pi/2. \quad (1)$$

The minimum distance of a trellis code is a measure of the coding gain of the convolutional code. The total noise power at the output of the first and second variable gain amplifiers 54 and 56 is given by the following expression:

$$N_{TOTAL}(\theta)=P_U\cos^2\theta+P_V\sin^2\theta. \quad (2)$$

The block 90 finds the value of $\theta$ that maximizes the following equation:

$$\frac{d_{min}^2(\theta)}{N_{TOTAL}(\theta)} = \frac{9-4\cos 2\theta}{P_U\cos^2\theta+P_V\sin^2\theta} \text{ for } 0\leq\theta\leq\frac{\pi}{2}. \quad (3)$$

Equation (3) balances the decrease in code gain as $\theta$ is varied against a reduction in output noise power. Under a white noise only condition, $P_U$ and $P_V$ will be equal, and equation (3) is maximized for $\theta=\pi/4$. Consequently, $$g_0=\cos\theta=\cos\frac{\pi}{4}=\frac{\sqrt{2}}{2} \quad (4)$$

and $$g_1=\sin\theta=\sin\frac{\pi}{4}=\frac{\sqrt{2}}{2} \quad (5)$$

and the gains are equal in both the U and the V dimensions. Under a more general interference condition, where $P_U$ and $P_V$ are not equal, the block 90 finds the value of $\theta$ that adjusts the relative gains $g_0$ and $g_1$ and balances the minimum distance of the code against the noise power in each dimension.

Accordingly, the gain values $g_0$ and $g_1$ relatively adjust the outputs of the first filter 42 and the second filter 44, respectively, dependent upon relative amounts of co-channel NTSC interference and white Gaussian noise picked up by the training signal during its transmission to the receiver which incorporates the gain setting arrangement 60. This training signal, for example, may be the frame sync portion of the conventional 8 VSB frame. Alternatively, a decision directed algorithm may be implemented whereby a sliced eight level signal, or a sliced U(n) and V(n), are used to produce the TU(n) and TV(n) signals.

The first and second filters 42 and 44 are well suited for co-channel NTSC interference because the correlation of the interference has a peak at a delay of D symbols (where D may be twelve for all delay elements of FIGS. 1 and 3).

Certain modifications of the present invention have been discussed above. Other modifications will occur to those practicing in the art of the present invention. For example, the present invention has been described in terms of co-channel NTSC interference, which is substantially ellipsoidal around the constellation points, and white Gaussian noise, which is substantially circular around the constellation points. However, it should be understood that the present invention is useful in terms of other interference, which is generally non-circular around the constellation points, and to other noise, which is generally circular around the constellation points.

Also, filters, other than the first and second filters 42 and 44 shown in FIG. 3, may be used dependent upon the noise statistics that are likely to be present. For example, filter pairs that are not exactly sum and difference filters but provide for a slightly different rotation of the coordinate axes may be used where the noise statistics are different than those described in relation to FIG. 3.

Moreover, the present invention is disclosed in terms of discrete components. These components may be analog and/or digital components. Moreover, the functions of these components may instead be performed in a computer.

Furthermore, although separate D symbol delay elements 48 and 52 are shown for the first and second filters 42 and 44, respectively, the D symbol delay elements 48 and 52 may be replaced by a single D symbol delay element which delays the received symbols R(n) to both of the summers 46 and 50.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. A receiver for decoding noisy encoded data received from a transmitting station, the receiver comprising:
    a) filtering means for variably filtering co-channel interference and noise in the encoded data dependent upon relative amounts of co-channel interference and noise in the encoded data, wherein the filtering means includes first and second filters, wherein the first filter is a comb filter arranged to filter co-channel interference, and wherein the second filter is arranged to filter noise; and, b) decoding means for decoding the filtered encoded data.

2. The receiver of claim 1 wherein the filtering means comprises:

filter controlling means for controlling relative amounts of filtering performed by the first and second filters dependent upon the relative amounts of co-channel interference and noise in the encoded data.

3. The receiver of claim 2 wherein the first and second filters have an input and corresponding first and second outputs, wherein the input of the first and second filters is arranged to receive the encoded data, wherein the filter controlling means comprises first and second filter controls, wherein the first filter control is between the first output and the decoding means, and wherein the second filter control is between the second output and the decoding means.

4. The receiver of claim 3 wherein the filter controlling means comprises:

first level setting means for variably setting a level of control of the first filter control; and, second level setting means for variably setting a level of control of the second filter control;

wherein the level of control of the first filter control and the level of control of the second filter control are relatively varied by the first and second level setting means.

5. The receiver of claim 1 wherein the filtering means comprises:

a delay element having an input and an output, wherein the input of the delay element receives the encoded data, and wherein the output of the delay element provides delayed encoded data;

wherein the first filter comprises a first summer having first and second inputs and an output, wherein the first input of the first summer receives the encoded data, wherein the second input of the first summer receives the delayed encoded data, and wherein the output of the first summer provides a difference between the encoded data and the delayed encoded data; and, wherein the second filter comprises a second summer having first and second inputs and an output, wherein the first input of the second summer receives the encoded data, wherein the second input of the second summer receives the delayed encoded data, and wherein the output of the second summer provides a sum of the encoded data and the delayed encoded data.

6. The receiver of claim 5 wherein the filtering means comprises first and second variable gain amplifiers, wherein the first variable gain amplifier is between the output of the first summer and the decoding means, and wherein the second variable gain amplifier is between the output of the second summer and the decoding means.

7. The receiver of claim 6 wherein the filtering means comprises gain setting means for variably setting a gain of the first variable gain amplifier relative to a gain of the second variable gain amplifier so as to variably filter co-channel interference and noise in the encoded data.

8. The receiver of claim 7 wherein the delay element is a first delay element, and wherein the gain setting means comprises:

a second delay element having an input and an output, wherein the input of the delay element receives a transmitted training signal, and wherein the output of the delay element provides a delayed transmitted training signal;

a third summer having first and second inputs and an output, wherein the first input of the third summer receives the transmitted training signal, wherein the second input of the third summer receives the delayed transmitted training signal, and wherein the output of the third summer provides a difference between the transmitted training signal and the delayed transmitted training signal;

a fourth summer having first and second inputs and an output, wherein the first input of the fourth summer receives the transmitted training signal, wherein the second input of the fourth summer receives the delayed transmitted training signal, and wherein the output of the fourth summer provides a sum of the transmitted training signal and the delayed transmitted training signal;

a fifth summer having first and second inputs and an output, wherein the first input of the fifth summer receives a reference training signal, wherein the second input of the fifth summer receives the difference between the transmitted training signal and the delayed transmitted training signal, and wherein the output of the fifth summer provides a first error representative of interference and noise in the transmitted training signal;

a sixth summer having first and second inputs and an output, wherein the first input of the sixth summer receives the reference training signal, wherein the second input of the sixth summer receives the sum of the transmitted training signal and the delayed transmitted training signal, and wherein the output of the sixth summer provides a second error representative of interference and noise in the transmitted training signal;

means for determining an average power $P_U$ of the first error;

means for determining an average power $P_V$ of the second error;

means for determining a substantial maximum value $\theta$ based upon the following equation:

$$\frac{d^2_{min}(\theta)}{N_{TOTAL}(\theta)} = \frac{9 - |4\cos 2\theta|}{P_U \cos^2\theta + P_V \sin^2\theta} \quad \text{for } 0 \leq \theta \leq \frac{\pi}{2},$$

and;

means for determining the gains of the first and second variable gain amplifiers based upon $\theta$.

9. The receiver of claim 1 wherein the decoding means comprises a Viterbi decoder, wherein the Viterbi decoder is arranged to generate branch metrics for each subset of a plurality of subsets according to a trellis, wherein each subset contains points corresponding to possible transitions of the encoded data, and wherein the trellis determines paths defined by the possible transitions of the encoded data.

10. The receiver of claim 9 wherein the filtering means comprises:

filter controlling means for controlling relative amounts of filtering performed by the first and second filters dependent upon the relative amounts of co-channel interference and noise in the encoded data.

11. The receiver of claim 10 wherein the first and second filters have an input and corresponding first and second outputs, wherein the input of the first and second filters is arranged to receive the encoded data, wherein the filter controlling means comprises first and second filter controls, wherein the first filter control is between the first output and the Viterbi decoder, and wherein the second filter control is between the second output and the Viterbi decoder.

12. The receiver of claim 11 wherein the filter controlling means comprises:
- first level setting means for variably setting a level of control of the first filter control; and,
- second level setting means for variably setting a level of control of the second filter control;
- wherein the level of control of the first filter control and the level of control of the second filter control are relatively varied by the first and second level setting means.

13. The receiver of claim 9 wherein the filtering means comprises:
- a delay element having an input and an output, wherein the input of the delay element receives the encoded data, and wherein the output of the delay element provides delayed encoded data;
- wherein the first filter comprises a first summer having first and second inputs and an output, wherein the first input of the first summer receives the encoded data, wherein the second input of the first summer receives the delayed encoded data, and wherein the output of the first summer provides a difference between the encoded data and the delayed encoded data; and,
- wherein the second filter comprises a second summer having first and second inputs and an output, wherein the first input of the second summer receives the encoded data, wherein the second input of the second summer receives the delayed encoded data, and wherein the output of the second summer provides a sum of the encoded data and the delayed encoded data.

14. The receiver of claim 13 wherein the filtering means comprises first and second variable gain amplifiers, wherein the first variable gain amplifier is between the output of the first summer and the Viterbi decoder, and wherein the second variable gain amplifier is between the output of the second summer and the Viterbi decoder.

15. The receiver of claim 14 wherein the filtering means further comprises gain setting means for variably setting a gain of the first variable gain amplifier relative to a gain of the second variable gain amplifier so as to variably filter co-channel interference and noise in the encoded data.

16. The receiver of claim 15 wherein the delay element is a first delay element, and wherein the gain setting means comprises:
- a second delay element having an input and an output, wherein the input of the delay element receives a transmitted training signal, and wherein the output of the delay element provides a delayed transmitted training signal;
- a third summer having first and second inputs and an output, wherein the first input of the third summer receives the transmitted training signal, wherein the second input of the third summer receives the delayed transmitted training signal, and wherein the output of the third summer provides a difference between the transmitted training signal and the delayed transmitted training signal;
- a fourth summer having first and second inputs and an output, wherein the first input of the fourth summer receives the transmitted training signal, wherein the second input of the fourth summer receives the delayed transmitted training signal, and wherein the output of the fourth summer provides a sum of the transmitted training signal and the delayed transmitted training signal;
- a fifth summer having first and second inputs and an output, wherein the first input of the fifth summer receives a reference training signal, wherein the second input of the fifth summer receives the difference between the transmitted training signal and the delayed transmitted training signal, and wherein the output of the fifth summer provides a first error representative of interference and noise in the transmitted training signal;
- a sixth summer having first and second inputs and an output, wherein the first input of the sixth summer receives the reference training signal, wherein the second input of the sixth summer receives the sum of the transmitted training signal and the delayed transmitted training signal, and wherein the output of the sixth summer provides a second error representative of interference and noise in the transmitted training signal;
- means for determining an average power $P_U$ of the first error;
- means for determining an average power $P_V$ of the second error;
- means for determining a substantially maximum value $\theta$ based upon the following equation:

$$\frac{d^2_{min}(\theta)}{N_{TOTAL}(\theta)} = \frac{9 - |4\cos 2\theta|}{P_U \cos^2\theta + P_V \sin^2\theta} \quad \text{for } 0 \leq \theta \leq \frac{\pi}{2},$$

and;
- means for determining the gains of the first and second variable gain amplifiers based upon $\theta$.

17. A receiver for decoding noisy encoded data transmitted by a transmitting station, the receiver comprising:
- a) a first filter, wherein the first filter has an input to receive the encoded data, wherein the first filter is a difference filter, and wherein the first filter has a first output to provide first filtered encoded data corresponding to a difference between the encoded data and delayed encoded data;
- b) a second filter, wherein the second filter has an input to receive the encoded data, wherein the second filter is a sum filter, and wherein the second filter has a second output to provide second filtered encoded data corresponding to a sum of the encoded data and the delayed encoded data; and,
- c) decoding means for decoding the first and second filtered encoded data.

18. The receiver of claim 17 wherein the first and second filters comprise first and second controlling means for controlling the first filtered encoded data provided by the first output of the first filter relative to the second filtered encoded data provided by the second output of the second filter in accordance with interference and noise in the encoded data.

19. The receiver of claim 17 comprising first and second variable gain amplifiers, wherein the first and second variable gain amplifiers are arranged to control the first filtered encoded data provided by the first output of the first filter relative to the second filtered encoded data provided by the second output of the second filter in accordance with interference and noise in the encoded data.

20. The receiver of claim 19 comprising gain setting means for variably setting a gain of the first variable gain amplifier relative to a gain of the second variable gain amplifier so as to control the first filtered encoded data provided by the first output of the first filter relative to the second filtered encoded data provided by the second output of the second filter in accordance with interference and noise in the encoded data.

21. The receiver of claim 20 wherein the gain setting means comprises:
- a delay element having an input and an output, wherein the input of the delay element receives a transmitted training signal, and wherein the output of the delay element provides a delayed transmitted training signal;
- a first summer having first and second inputs and an output, wherein the first input of the first summer receives the transmitted training signal, wherein the second input of the first summer receives the delayed transmitted training signal, and wherein the output of the first summer provides a difference between the transmitted training signal and the delayed transmitted training signal;
- a second summer having first and second inputs and an output, wherein the first input of the second summer receives the transmitted training signal, wherein the second input of the second summer receives the delayed transmitted training signal, and wherein the output of the second summer provides a sum of the transmitted training signal and the delayed transmitted training signal;
- a third summer having first and second inputs and an output, wherein the first input of the third summer receives a reference training signal, wherein the second input of the third summer receives the difference between the transmitted training signal and the delayed transmitted training signal, and wherein the output of the third summer provides a first error representative of interference and noise in the transmitted training signal;
- a fourth summer having first and second inputs and an output, wherein the first input of the fourth summer receives the reference training signal, wherein the second input of the fourth summer receives the sum of the transmitted training signal and the delayed transmitted training signal, and wherein the output of the fourth summer provides a second error representative of interference and in the transmitted training signal;
- means for determining an average power $P_U$ of the first error;
- means for determining an average power $P_V$ of the second error;
- means for determining a substantially maximum value $\theta$ based upon the following equation:

$$\frac{d^2_{min}(\theta)}{N_{TOTAL}(\theta)} = \frac{9 - |4\cos 2\theta|}{P_U \cos^2\theta + P_V \sin^2\theta} \quad \text{for } 0 \leq \theta \leq \frac{\pi}{2},$$

and;
- means for determining the gains of the first and second variable gain amplifiers based upon $\theta$.

22. The receiver of claim 17 wherein the decoding means comprises a Viterbi decoder, wherein the Viterbi decoder is arranged to generate branch metrics for each subset of a plurality of subsets according to a trellis, wherein each subset contains points corresponding to possible transitions of the encoded data, and wherein the trellis determines paths defined by the possible transitions of the encoded data.

23. The receiver of claim 22 wherein the first and second filters comprise first and second controlling means for controlling the first filtered encoded data provided by the first output of the first filter relative to the second filtered encoded data provided by the second output of the second filter in accordance with interference and noise in the encoded data.

24. The receiver of claim 22 wherein the first filter comprises a first variable gain amplifier, wherein the second filter comprises a second variable gain amplifier, wherein the first and second variable gain amplifiers are arranged to control the first filtered encoded data provided by the first output of the first filter relative to the second filtered encoded data provided by the second output of the second filter in accordance with interference and noise in the encoded data.

25. The receiver of claim 24 further comprising gain setting means for variably setting a gain of the first variable gain amplifier relative to a gain of the second variable gain amplifier so as to control the first filtered encoded data provided by the first output of the first filter relative to the second filtered encoded data provided by the second output of the second filter in accordance with interference and noise in the encoded data.

26. The receiver of claim 25 wherein the gain setting means comprises:
- a delay element having an input and an output, wherein the input of the delay element receives a transmitted training signal, and wherein the output of the delay element provides a delayed transmitted training signal;
- a first summer having first and first inputs and an output, wherein the first input of the first summer receives the transmitted training signal, wherein the first input of the first summer receives the delayed transmitted training signal, and wherein the output of the first summer provides a difference between the transmitted training signal and the delayed transmitted training signal;
- a second summer having first and second inputs and an output, wherein the first input of the second summer receives the transmitted training signal, wherein the second input of the second summer receives the delayed transmitted training signal, and wherein the output of the second summer provides a sum of the transmitted training signal and the delayed transmitted training signal;
- a third summer having first and second inputs and an output, wherein the first input of the third summer receives a reference training signal, wherein the second input of the third summer receives the difference between the transmitted training signal and the delayed transmitted training signal, and wherein the output of the third summer provides a first error representative of interference and noise in the transmitted training signal;
- a fourth summer having first and second inputs and an output, wherein the first input of the fourth summer receives the reference training signal, wherein the second input of the fourth summer receives the sum of the transmitted training signal and the delayed transmitted training signal, and wherein the output of the fourth summer provides a second error representative of interference and noise in the transmitted training signal;
- means for determining an average power $P_U$ of the first error;
- means for determining an average power $P_V$ of the second error;
- means for determining a substantially maximum value $\theta$ based upon the following equation:

$$\frac{d^2_{min}(\theta)}{N_{TOTAL}(\theta)} = \frac{9 - |4\cos 2\theta|}{P_U \cos^2\theta + P_V \sin^2\theta} \quad \text{for } 0 \leq \theta \leq \frac{\pi}{2},$$

and;
- means for determining the gains of the first and second variable gain amplifiers based upon $\theta$.

27. A receiver for decoding encoded data transmitted by a transmitting station, the receiver comprising:

a) first and second filtering means for filtering the encoded data and for providing corresponding first and second filtered outputs;

b) controlling means for relatively controlling the first and second filtered outputs so as to provide corresponding first and second relatively controlled filtered outputs in order to suppress co-channel interference and noise in the encoded data; and, c) decoding means for decoding the first and second relatively controlled filtered outputs.

28. The receiver of claim 27 wherein the first and second filters comprise:

delaying means for delaying the encoded data;

subtracting means for subtracting the delayed encoded data from the encoded data in order to provide the first filtered output; and, summing means for summing the encoded data and the delayed encoded data in order to provide the second filtered output.

29. The receiver of claim 28 wherein the controlling means comprises:

a first variable gain amplifier connected to an output of the first filter;

a second variable gain amplifier connected to an output of the second filter; and, gain setting means for variably setting a first gain of the first variable gain amplifier relative to a second gain of the second variable gain amplifier so as to variably suppress co-channel interference and noise in the encoded data.

30. The receiver of claim 29 wherein the gain setting means comprises:

first gain determining means for determining the first gain based upon a transmitted training signal and a reference training signal; and, second gain determining means for determining the second gain based upon the transmitted training signal and the reference training signal.

31. The receiver of claim 27 wherein the decoding means comprises a Viterbi decoder, wherein the Viterbi decoder is arranged to generate branch metrics for each subset of a plurality of subsets according to a trellis, wherein each subset contains points corresponding to possible transitions of the encoded data, and wherein the trellis determines paths defined by the possible transitions of the encoded data.

32. The receiver of claim 31 wherein the first and second filters comprise:

a delay element having an input and an output, wherein the input of the delay element receives the encoded data, and wherein the output of the delay element provides delayed encoded data;

subtracting means for subtracting the delayed encoded data from the encoded data in order to provide the first filtered output; and, summing means for summing the encoded data and the delayed encoded data in order to provide the second filtered output.

33. The receiver of claim 32 wherein the controlling means comprises:

a first variable gain amplifier connected to an output of the first filter;

a second variable gain amplifier connected to an output of the second filter; and, gain setting means for variably setting a first gain of the first variable gain amplifier relative to a second gain of the second variable gain amplifier so as to variably suppress relative amounts of co-channel interference and noise in the encoded data.

34. The receiver of claim 33 wherein the gain setting means comprises:

first gain determining means for determining the first gain based upon a transmitted training signal and a reference training signal; and, second gain determining means for determining the second gain based upon the transmitted training signal and the reference training signal.

35. A receiver for decoding encoded data transmitted by a transmitting station, the receiver comprising:

a co-channel interference filter being arranged to filter co-channel interference from the encoded data;

a noise filter being arranged to filter noise from the encoded data;

a controller being arranged to relatively control the co-channel interference filter and the noise filter so as relatively filter out co-channel interference and noise from the encoded data; and, a decoder being arranged to decode the relatively filtered encoded data.

36. The receiver of claim 35 further comprising a delay element, wherein the delay element is arranged to delay the encoded data, wherein the co-channel interference filter comprises the delay element and a subtractor, wherein the subtractor is arranged to subtract the delayed encoded data from the encoded data, wherein the noise filter comprises the delay element and a summer, and wherein the summer is arranged to sum the delayed encoded data and the encoded data.

37. The receiver of claim 36 wherein delay element comprises first and second delay elements.

* * * * *